(12) United States Patent
Saito et al.

(10) Patent No.: US 9,100,000 B2
(45) Date of Patent: Aug. 4, 2015

(54) SEMICONDUCTOR DEVICE

(75) Inventors: Jun Saito, Nagoya (JP); Masuhisa Hirose, Nagoya (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 287 days.

(21) Appl. No.: 13/560,194

(22) Filed: Jul. 27, 2012

(65) Prior Publication Data
US 2013/0069694 A1 Mar. 21, 2013

(30) Foreign Application Priority Data

Sep. 21, 2011 (JP) .................................. 2011-205745

(51) Int. Cl.
| | | |
|---|---|---|
| H03K 17/00 | (2006.01) |
| H01L 29/40 | (2006.01) |
| H01L 29/739 | (2006.01) |
| H01L 29/861 | (2006.01) |
| H01L 29/06 | (2006.01) |
| H01L 29/10 | (2006.01) |

(52) U.S. Cl.
CPC .............. *H03K 17/00* (2013.01); *H01L 29/063* (2013.01); *H01L 29/0615* (2013.01); *H01L 29/1095* (2013.01); *H01L 29/402* (2013.01); *H01L 29/404* (2013.01); *H01L 29/7397* (2013.01); *H01L 29/8611* (2013.01); *H01L 29/0638* (2013.01); *H01L 29/0692* (2013.01)

(58) Field of Classification Search
CPC . H01L 29/404; H01L 29/402; H01L 29/7397; H01L 29/1095; H01L 29/0615; H01L 29/063; H01L 29/8611; H03K 17/00

USPC .......................................................... 327/109
See application file for complete search history.

(56) References Cited

U.S. PATENT DOCUMENTS

| | | | | | |
|---|---|---|---|---|---|
| 5,977,569 | A | * | 11/1999 | Li ................................. | 257/119 |
| 2008/0012610 | A1 | * | 1/2008 | Aoki et al. .................... | 327/109 |
| 2012/0043581 | A1 | * | 2/2012 | Koyama et al. ............... | 257/140 |

FOREIGN PATENT DOCUMENTS

| | | |
|---|---|---|
| JP | A-4-127540 | 4/1992 |
| JP | H06-232426 A | 8/1994 |
| JP | A-7-193018 | 7/1995 |
| JP | A-2002-231944 | 8/2002 |
| WO | WO 2012/131878 A1 | 10/2012 |

OTHER PUBLICATIONS

Senoo, Masaru; U.S. Appl. No. 13/640,447, filed Oct. 10, 2012.

* cited by examiner

*Primary Examiner* — Walter H Swanson
(74) *Attorney, Agent, or Firm* — Oliff PLC

(57) ABSTRACT

A semiconductor device may be provided with a semiconductor substrate, an insulating film disposed on a surface of the semiconductor substrate, at least one electrode disposed on a surface of the insulating film, and a voltage applying circuit configured to apply a first voltage to the at least one electrode. The semiconductor substrate may be provided with a cell region and a non-cell region adjacent to the cell region. The cell region is provided with a semiconductor element, and the non-cell region is provided with a withstand voltage structure. The insulating film may be disposed on a surface of the non-cell region. The at least one electrode may be electrically insulated from the semiconductor substrate. The voltage applying circuit may apply the first voltage to the electrode during at least a part of a first period in which a second voltage is not applied to the semiconductor element.

8 Claims, 4 Drawing Sheets

SEMICONDUCTOR DEVICE

CROSS-REFERENCE TO RELATED APPLICATION

This application claims priority to Japanese Patent Application No. 2011-205745 filed on Sep. 21, 2011, the contents of which are hereby incorporated by reference into the present application.

TECHNICAL FIELD

The present teachings relate to a semiconductor device.

DESCRIPTION OF RELATED ART

Semiconductor devices have been proposed in which a withstand voltage structure (for example, an FLR (Field Limiting Ring) structure or a RESURF (REduced SURface Field) structure) is formed on a semiconductor substrate in order to increase a withstand voltage of the semiconductor device. With the semiconductor device comprising the withstand voltage structure, an adhesion of movable ions to an insulating film on a surface of a semiconductor substrate may cause a decline in the withstand voltage. Therefore, a technique has been proposed for preventing the decline in the withstand voltage due to the adhesion of the movable ions (Japanese Patent Application Publication No. H04-127540).

In a semiconductor device disclosed in Japanese Patent Application Publication No. H04-127540, a plurality of field rings is formed in a non-cell region on a semiconductor substrate. An insulating film is formed on a surface of the non-cell region on the semiconductor substrate. A conductive layer is formed on a surface of the insulating film. The conductive layer is positioned above the plurality of field rings. A surface of the conductive layer is covered by an insulating film. With this semiconductor device, even if the movable ions adhere to the insulating film on the surface of the semiconductor substrate, the movable ions are blocked by the conductive layer positioned above the field rings. Accordingly, the decline in the withstand voltage of the semiconductor device can allegedly be prevented.

BRIEF SUMMARY OF INVENTION

With the technique disclosed in Japanese Patent Application Publication No. H04-127540, although the movable ions adhered to the insulating film can be blocked to a certain degree, not all of the movable ions can be blocked. Consequently, the movable ions not blocked by the conductive layer exist in the insulating film. Therefore, when the semiconductor device is driven and a voltage is applied to the semiconductor substrate, the voltage causes the movable ions to move in the insulating film and become unevenly located at a particular portion in the insulating film. The movable ions unevenly located at the particular portion in the insulating film affect the withstand voltage structure and reduces the withstand voltage of the semiconductor device.

It is an object of the present teachings to provide a technique for suppressing the decline in the withstand voltage of the semiconductor device by controlling movement of the movable ions in the insulating film.

A semiconductor device disclosed in the present specification may comprise a semiconductor substrate, an insulating film, at least one electrode, and a voltage applying circuit. The semiconductor substrate may comprise a cell region and a non-cell region adjacent to the cell region. The insulating film may be disposed on a surface of the non-cell region of the semiconductor substrate. The at least one electrode may be disposed on a surface of the insulating film. The voltage applying circuit may be configured to apply a first voltage to the at least one electrode. The cell region may comprise a semiconductor element. The non-cell region may comprise a withstand voltage structure. The at least one electrode is electrically insulated from the semiconductor substrate. The voltage applying circuit may apply the first voltage to the at least one electrode during at least a part of a first period in which a second voltage is not applied to the semiconductor element.

With the semiconductor device described above, since the at least one electrode disposed on the surface of the insulating film is electrically insulated from the semiconductor substrate, the voltage applying circuit is able to apply the first voltage that is independent from the semiconductor substrate to the at least one electrode. Therefore, by adjusting the first voltage that is applied to the at least one electrode, a desired voltage can be applied to the insulating film to control a movement of movable ions in the insulating film. Consequently, even if the movable ions become unevenly located at a particular portion in the insulating film, the movable ions can be dispersed within the insulating film by applying the first voltage to the at least one electrode. Accordingly, a decline in a withstand voltage of the semiconductor device can be prevented. In addition, the voltage applying circuit applies the first voltage to the at least one electrode during the first period in which the second voltage is not applied to the semiconductor element. This in other words may be termed as a period in which the semiconductor element is not driven. Therefore, by applying the first voltage to the at least one electrode, a change in characteristics of the semiconductor element can be prevented.

DETAILED DESCRIPTION OF INVENTION

Figure 1:
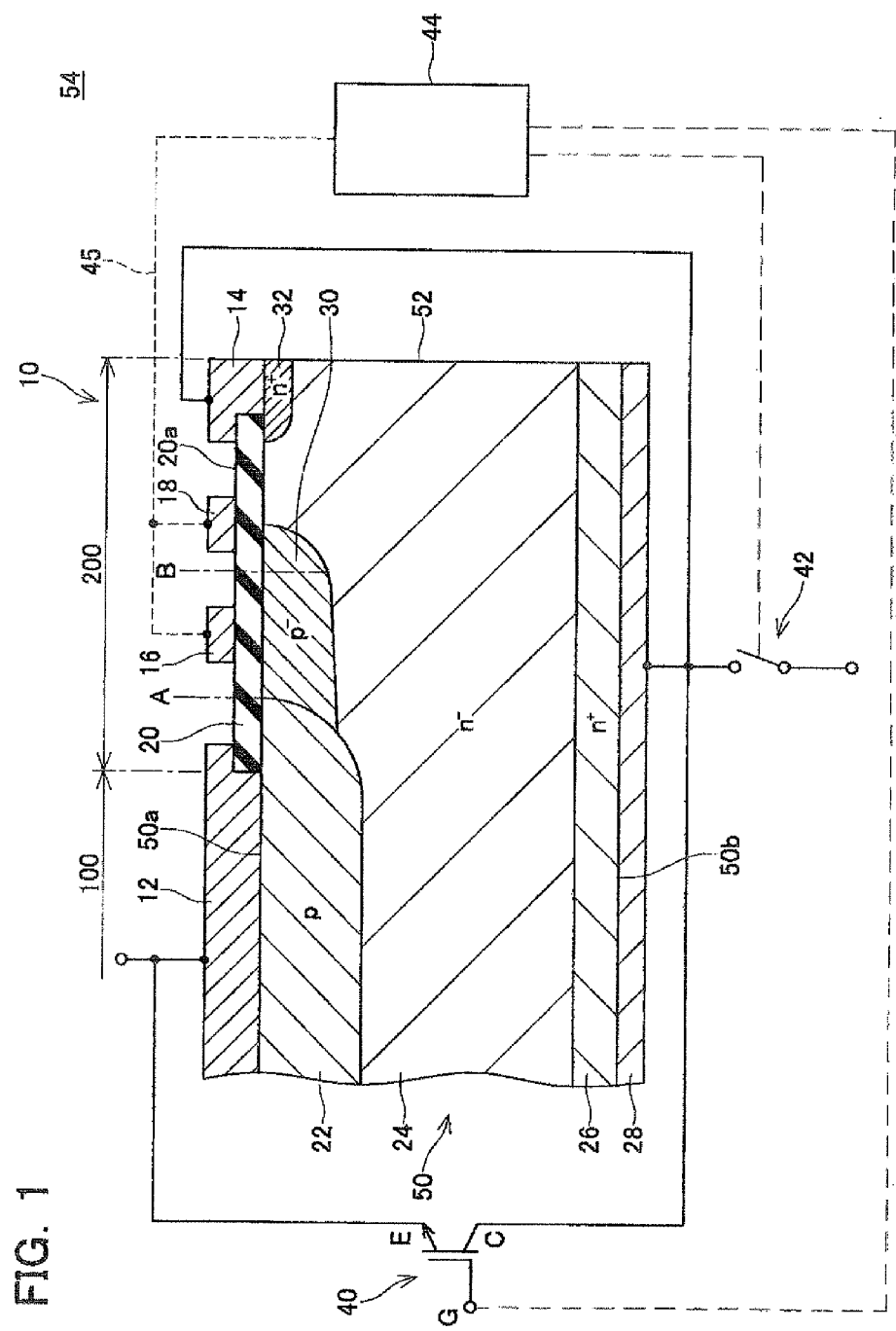
FIG. 1 schematically shows a configuration of a semiconductor device 54 according to a first embodiment, and shows a cross section (a cross section of a position indicated by a line 14 in FIG. 2) of a diode 10 comprising the semiconductor device 54.

In a non-cell region of a semiconductor device disclosed herein, various withstand voltage structures can be used. For example, the withstand voltage structure may comprise a first semiconductor region of a first conductive type and a second semiconductor region of a second conductive type, where the first semiconductor region is exposed at a surface of a semiconductor substrate, a part of the second semiconductor region is exposed at the surface of the semiconductor substrate, and the second semiconductor region is in contact with a lower surface and one side surface of the first semiconductor region. Here, the one side surface is located on a relatively far side from a cell region. In this case, an insulating film is favorably disposed on surfaces of the first and second semiconductor regions. As used herein, the "first conductive type" and the "second conductive type" respectively refer to one of an n type and a p type. In other words, if the "first conductive type" is the n type, then the "second conductive type" is the p type, and if the "first conductive type" is the p type, then the "second conductive type" is the n type.

In the semiconductor device described above, when a voltage is applied to the non-cell region of the semiconductor substrate, a depletion layer spreads from a boundary surface between the first semiconductor region and the second semiconductor region. As a result, a withstand voltage is secured. The insulating film is disposed on the surfaces of the first and second semiconductor regions, and a movement of movable ions within the insulating film is controlled by at least one electrode. Therefore, the movable ions can be prevented from affecting the depletion layer that spreads from the boundary surface between the first semiconductor region and the second semiconductor region, and a decline in a withstand voltage of the semiconductor device can be suppressed.

Moreover, in a case in which the withstand voltage structure described above is used, favorably, when the semiconductor substrate is viewed in a plan view, a first conductive type impurity concentration of a first end of the first semiconductor region is higher than that of a second end of the first semiconductor region, the first end of the first semiconductor region is on a relatively closer side to the cell region, and the second end of the first semiconductor region is on the relatively far side from the cell region.

In addition, favorably, the voltage applying circuit does not apply the first voltage to the at least one electrode during a second period in which the second voltage is applied to the semiconductor element. According to such a configuration, the first voltage is not applied to the at least one electrode during the second period in which the second voltage is applied to the semiconductor element, which in other words is a period in which the semiconductor element may be driven. Therefore, by applying the first voltage to the at least one electrode, a change in characteristics of the semiconductor element that is being driven can be prevented.

Furthermore, the voltage applying circuit can apply the first voltage to the at least one electrode at various timings. For example, the voltage applying circuit may apply the first voltage to the at least one electrode during booting of the semiconductor device before the second voltage is applied to the semiconductor element.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Hereinafter, an embodiment will be described with reference to the drawings. A semiconductor device 54 according to the present embodiment is a power converter (inverter) which is mounted to a vehicle such as an automobile and which converts inputted DC power into AC power and supplies the AC power to a motor. As shown in FIG. 1, the semiconductor device 54 comprises an IGBT (Insulated Gate Bipolar Transistor) 40, a diode 10, a switch 42, and a drive circuit 44 (corresponding to an example of a voltage applying circuit according to the claims). While the semiconductor device 54 comprises a plurality of switching circuits comprising the IGBT 40 and the diode 10, only one set of the IGBT 40 and the diode 10 is shown in FIG. 1. In addition, among the respective components of the semiconductor device 54, since the IGBT 40 is similar to an IGBT used in a conventional power converter (inverter), a detailed description thereof will be omitted.

The IGBT 40 is a switching element that is switched between an on state and an off state according to a voltage applied to a gate electrode. When the IGBT 40 is turned on, a current is able to flow between an emitter electrode and a collector electrode of the IGBT 40. When the IGBT 40 is turned off, a current flowing between the emitter electrode and the collector electrode is interrupted. The diode 10 is connected to the IGBT 40 in inverse-parallel. More specifically, an upper surface electrode (an anode electrode) 12 of the diode 10 is connected to the emitter electrode of the IGBT 40, and a lower surface electrode (a cathode electrode) 28 of the diode 10 is connected to the collector electrode of the IGBT 40. A detailed configuration of the diode 10 will be described later. A switch 42 is disposed between the semiconductor device 54 and an external DC power supply (not shown). When the switch 42 is turned on, the external DC power supply and the semiconductor device 54 are connected to each other. When the switch 42 is turned off, the external DC power supply and the semiconductor device 54 are disconnected from each other. The drive circuit 44 is connected to the IGBT 40, the diode 10, and the switch 42. The drive circuit 44 provides on-off control of the switch 42 and on-off control of the IGBT 40, and applies a voltage to control electrodes 16 and 18 (corresponding to an example of at least one electrode according to the claims) of the diode 10.

Figure 2:
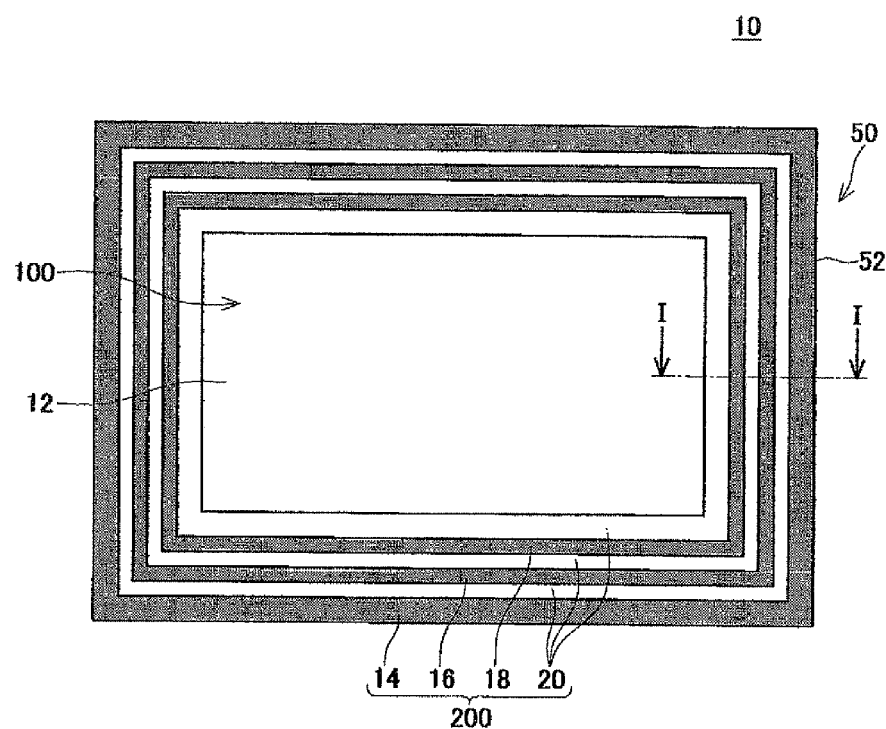
FIG. 2 is a plan view of the diode 10.

Next, a configuration of the diode 10 will be described in detail. As shown in FIG. 2, the diode 10 comprises a semiconductor element region 100 (corresponding to an example of a cell region) in which a semiconductor element (in other words, the diode) is formed, and a peripheral withstand voltage region 200 (corresponding to an example of a non-cell region) that surrounds the semiconductor element region 100. The semiconductor element region 100 is formed at an approximately central portion of a semiconductor substrate 50. The peripheral withstand voltage region 200 is formed along an outer peripheral edge 52 of the semiconductor substrate 50. The peripheral withstand voltage region 200 is a region for securing a withstand voltage between the outer peripheral edge 52 of the semiconductor substrate 50 and the semiconductor element region 100.

As shown in FIGS. 1 and 2, the diode 10 comprises the semiconductor substrate 50, an insulating film 20, the upper surface electrode 12, an outer peripheral electrode 14, the control electrodes 16 and 18, and the lower surface electrode 28. The semiconductor substrate 50 is made of silicon. The upper surface electrode 12 is formed on an upper surface 50a of the semiconductor element region 100 of the semiconductor substrate 50. The upper surface electrode 12 is an anode electrode of the diode. The lower surface electrode 28 is formed over an entirety (in other words, both the semiconductor element region 100 and the peripheral withstand voltage region 200) of a lower surface 50b of the semiconductor substrate 50. The lower surface electrode 28 is a cathode electrode of the diode. The outer peripheral electrode 14 is formed within the peripheral withstand voltage region 200 on the upper surface 50a of the semiconductor substrate 50, and extends along the outer peripheral edge 52 of the semiconductor substrate 50. The outer peripheral electrode 14 is a channel stop electrode. The insulating film 20 is formed within the peripheral withstand voltage region 200 on the upper surface 50a of the semiconductor substrate 50 between the upper surface electrode 12 and the outer peripheral electrode 14. Silicon oxide ($SiO_2$), polyimide, or the like may be used as the insulating film 20. The control electrodes 16 and 18 are formed on an upper surface 20a of the insulating film 20 separated from each other by an interval. As shown in FIG. 2, the control electrodes 16 and 18 are formed in a ring shape so as to surround the semiconductor element region 100. An interval is provided between the upper surface electrode 12 and the control electrode 16, and an interval is also provided between the control electrode 18 and the outer peripheral electrode 14. Therefore, the control electrodes 16 and 18 are electrically insulated from the upper surface electrode 12, the semiconductor substrate 50, and the outer peripheral electrode 14. The control electrodes 16 and 18 are connected to the drive circuit 44 by a wiring 45, and are capable of applying a voltage independent from the other electrodes 12, 14, and 28 of the diode 10. Moreover, surfaces of the insulating film 20 and the control electrodes 16 and 18 may be further covered by a protective film made of polyimide or the like.

As shown in FIG. 1, an anode region 22, a drift region 24, a cathode region 26, a RESURF region 30, and an outer peripheral electrode contact region 32 are formed inside the semiconductor substrate 50. The anode region 22 is formed approximately at center of the semiconductor substrate 50 in a range that is exposed at the upper surface 50a of the semiconductor substrate 50. The anode region 22 is a p type region that contains a high concentration of p type impurities. The anode region 22 is ohmically connected to the upper surface electrode 12. The drift region 24 is formed below the anode region 22, the RESURF region 30, and the outer peripheral electrode contact region 32. The drift region 24 is an n type region that contains a low concentration of n type impurities. A part of the drift region 24 is exposed at the upper surface 50a of the semiconductor substrate 50 between the RESURF region 30 and the outer peripheral electrode contact region 32. Therefore, the drift region 24 is in contact with both an outer side surface of the RESURF region 30 and an inner side surface of the outer peripheral electrode contact region 32. The cathode region 26 is formed below the drift region 24. The cathode region 26 is formed in a range that is exposed at the lower surface 50b of the semiconductor substrate 50. The cathode region 26 is an n type region that contains a high concentration of n type impurities. The concentration of n type impurities of the cathode region 26 is higher than the concentration of n type impurities of the drift region 24. The cathode region 26 is ohmically connected to the lower surface electrode 28.

The outer peripheral electrode contact region 32 is an n type region that contains a high concentration of n type impurities. The outer peripheral electrode contact region 32 is formed on a peripherally outermost side of the peripheral withstand voltage region 200 in a range that is exposed at the upper surface 50a of the semiconductor substrate 50. In other words, the outer peripheral electrode contact region 32 is formed at a position that is exposed at the outer peripheral edge 52 of the semiconductor substrate 50. The concentration of n type impurities of the outer peripheral electrode contact region 32 is higher than the concentration of n type impurities of the drift region 24. The outer peripheral electrode contact region 32 is ohmically connected to the outer peripheral electrode 14. The outer peripheral electrode contact region 32 is a channel stop region.

The RESURF region 30 is a p type region that contains a low concentration of p type impurities. The RESURF region 30 is formed within the peripheral withstand voltage region 200 in a range that is exposed at the upper surface 50a of the semiconductor substrate 50. One end of the RESURF region 30 (on a center side of the semiconductor substrate 50, which may be termed as a relatively closer side to the anode region 22) is in contact with the anode region 22. Another end of the RESURF region 30 (on an outer peripheral edge 52 side of the semiconductor substrate 50, which may be termed as a relatively far side to the anode region 22) is in contact with the drift region 24. The concentration of p type impurities of the RESURF region 30 is lower than the concentration of p type impurities of the anode region 22. In addition, a distribution of the concentration of p type impurities in the RESURF region 30 is higher on an anode region 22 side and lower on an outer peripheral electrode contact region 32 side. The drift region 24 described above is located between the outer peripheral electrode contact region 32 and the RESURF region 30. The outer peripheral electrode contact region 32 is isolated from the RESURF region 30 by the drift region 24. Moreover, in one embodiment, an isolation region that separates the anode region 22 from the RESURF region 30 may be formed between the anode region 22 and the RESURF region 30.

As is apparent from FIGS. 1 and 2, in the present embodiment, the semiconductor element region 100 is a region in which the upper surface electrode 12 is in contact with the upper surface 50a of the semiconductor substrate 50. The anode region 22, the drift region 24, and the cathode region 26 are formed in the semiconductor element region 100 and constitute a diode. The RESURF region 30, the drift region 24, the cathode region 26, and the outer peripheral electrode contact region 32 are formed in the peripheral withstand voltage region 200, and the RESURF region 30 and the drift region 24 constitute a RESURF structure (a withstand voltage structure). The control electrode 16 is disposed above the RESURF region 30, and the control electrode 18 is disposed above a boundary between the RESURF region 30 and the drift region 24 (an end on an outer peripheral end side of the RESURF region 30).

Next, operations of the aforementioned semiconductor device 54 will be described. The semiconductor device 54 according to the present embodiment may be switched between (1) a state in which the semiconductor device 54 and an external DC power supply are connected to each other, and (2) a state in which the semiconductor device 54 and the external DC power supply are not connected to each other. Hereinafter, each state will be described. Moreover, as described above, among the respective components of the semiconductor device 54, the IGBT 40 is similar to an IGBT used in a known power converter (inverter). Therefore, a detailed description of the IGBT 40 will be omitted.

(1) State in which Semiconductor Device 54 and External DC Power Supply are Connected In order to create the state in which the semiconductor device 54 and the external DC power supply are connected to each other, the drive circuit 44 turns on the switch 42. In this state, due to the on-off control of a plurality of IGBTs 40 by the drive circuit 44, the semiconductor device 54 converts DC power supplied from the external DC power supply into AC power and supplies the AC power to a motor. The state in which the semiconductor device 54 and the external DC power supply are connected to each other may be switched among (a) a state in which a current flows through the IGBT 40, (b) a state in which a return current flows through the diode 10, and (c) a state in which a current does not flow through the IGBT 40 and the diode 10. Moreover, in the state in which the semiconductor device 54 and the external DC power supply are connected to each other, the drive circuit 44 is not applying a voltage to the control electrodes 16 and 18. As a result, a voltage of the control electrodes 16 and 18 is 0 V.

(a) State in which a Current Flows through IGBT 40

In order to apply the current to the IGBT 40, a state is created in which a high potential is applied to the collector electrode of the IGBT 40 while a low potential is applied to the emitter electrode of the TGBT 40, and the drive circuit 44 applies an on-potential to the gate electrode of the IGBT 40. Accordingly, the IGBT 40 becomes conductive (enters an on state) and the current flows through the IGBT 40. At this point, since the high potential is applied to the lower surface electrode (cathode electrode) 28 of the diode 10 while the low potential is applied to the upper surface electrode (anode electrode) 12 of the diode 10, the current does not flow through the diode 10. Moreover, in the state in which the current flows through the IGBT 40, a large potential difference is not created between the upper surface electrode 12 and the lower surface electrode 28 of the diode 10. When the drive circuit 44 stops applying the on-potential to the gate electrode of the IGBT 40, the IGBT 40 changes to the off state and the current flowing through the IGBT 40 is interrupted.

(b) State in which a Return Current Flows Through Diode 10

As described above, since the semiconductor device 54 is connected to the motor, when the current flowing through the motor is interrupted, a high voltage is generated by an inductance component of the motor. In such a case, a return current flows through the diode 10 that is connected in inverse-parallel to the IGBT 40. In other words, when a potential of the emitter electrode of the IGBT 40 rises relative to a potential of the collector electrode of the IGBT 40, the potential of the upper surface electrode 12 of the diode 10 simultaneously rises relative to the potential of the lower surface electrode 28 of the diode 10, and the diode 10 is turned on. When the diode 10 is turned on, the current flows within the diode 10 from the upper surface electrode 12 to the lower surface electrode 28. Accordingly, a high voltage is prevented from acting on the IGBT 40 and destruction of the IGBT 40 is prevented.

(c) State in which a Current does not Flow through TGBT 40 and Diode 10

In this state, the potentials of the outer peripheral electrode 14 and the lower surface electrode 28 of the diode 10 increase relative to the potential of the upper surface electrode 12 of the diode 10. As a result, the depletion layer extends from the anode region 22 into the drift region 24. In the peripheral withstand voltage region 200, the depletion layer extends from the anode region 22 toward an outer peripheral side. The extension of the depletion layer toward the outer peripheral side is promoted by the RESURF region 30. Accordingly, a concentration of an electric field in a vicinity of the anode region 22 can be suppressed. The depletion layer in the peripheral withstand voltage region 200 reaches the outer peripheral electrode contact region 32. Since the outer peripheral electrode contact region 32 has the high concentration of n type impurities, the depletion layer does not extend into the outer peripheral electrode contact region 32. Therefore, the depletion layer does not extend to the outer peripheral side relative to the outer peripheral electrode contact region 32, and the depletion layer is prevented from extending to the outer peripheral edge 52 of the semiconductor substrate 50. As described above, when the reverse voltage is applied between the upper surface electrode 12 and the lower surface electrode 28 of the diode 10 in the off-state of the IGBT 40, the depletion layer is formed in a region between the anode region 22 and the outer peripheral electrode contact region 32 (in other words, in the RESURF region 30 and the drift region 24). This depleted region undertakes a large portion of the voltage between the upper surface electrode 12 and the outer peripheral electrode 14. Accordingly, electric field concentration is mitigated and the high withstand voltage is realized.

As described earlier, in the present embodiment, the concentration of p type impurities of the RESURF region 30 is lower than the concentration of p type impurities of the anode region 22. Therefore, the RESURF region 30 facilitates the extension of the depletion layer. In addition, the distribution of the concentration of p type impurities in the RESURF region 30 gradually decreases from the anode region 22 side toward the outer peripheral electrode contact region 32 side. Therefore, a slope of the electric field in the anode region 22 and the RESURF region 30 is prevented from becoming steep, and the electric field concentration is prevented.

Moreover, the RESURF region 30 having the distribution of the concentration of p type impurities such as described above can be formed using various methods. For example, by gradually reducing an opening size of a resist during an injection of p type impurities from a central side to an outer peripheral side, the RESURF region 30 having the distribution of the concentration of p type impurities such as described above can be formed. Alternatively, the RESURF region 30 having the distribution of the concentration of p type impurities such as described above can be formed by gradually increasing an opening interval of the resist from the central side to the outer peripheral side.

Next, an effect of the movable ions on the withstand voltage of the diode 10 will be described. When the movable ions adhere to the surface of the insulating film 20, the movable ions move within the insulating film 20. As described earlier, in the state in which the semiconductor device 54 is connected to the external DC power supply (the on-state of the switch 42), the potential on the semiconductor substrate 50 side of the insulating film 20 becomes higher than the potential on the control electrodes 16 and 18 side. In other words, since the voltage of the control electrodes 16 and 18 is 0 V, the voltage of the semiconductor substrate 50 becomes higher than the voltage of the control electrodes 16 and 18. Therefore, positively-charged movable ions adhered to the insulating film 20 move to the control electrodes 16 and 18 side, and negatively-charged movable ions adhered to the insulating film 20 move to the semiconductor substrate 50 side. Consequently, over time, the movable ions adhered to the insulating film 20 become unevenly located on the semiconductor substrate 50 side or on the control electrodes 16 and 18 side in the insulating film 20. As a result, a distribution of carriers on the semiconductor substrate 50 is disturbed, which in turn affects formation of the depletion layer and causes a reduction of the withstand voltage of the diode 10.

(2) State in which Semiconductor Device 54 and External DC Power Supply are not Connected As described above, in the state in which the semiconductor device 54 and the external DC power supply are connected to each other, the movable ions adhered to the insulating film 20 move within and become unevenly located in the insulating film 20 over time. Therefore, in the present embodiment, a predetermined voltage is applied only for a predetermined period of time to the control electrodes 16 and 18 in the state in which the semiconductor device 54 and the external DC power supply are not connected to each other. In other words, the drive circuit 44 applies the voltage to the control electrodes 16 and 18 so that a potential of the control electrodes 16 and 18 becomes higher than a potential of the semiconductor substrate 50. Specifically, in the state in which the semiconductor device 54 and the external DC power supply are not connected to each other, since the semiconductor substrate 50 is grounded, a positive voltage (for example, +5 V) is applied to the control electrodes 16 and 18. When the positive voltage is applied to the control electrodes 16 and 18, a control electrodes 16 and 18 side of the insulating film 20 acquires a high potential and a semiconductor substrate 50 side of the insulating film 20 acquires a low potential. In other words, a state is created that is opposite to the state in which the semiconductor device 54 and the external DC power supply are connected to each other. Therefore, a direction of movement of the movable ions unevenly located in the insulating film 20 is opposite to a direction of movement of the movable ions in a state in which the semiconductor device 54 and the external DC power supply are connected to each other. For example, when positively-charged movable ions are unevenly located on the control electrodes 16 and 18 side in the insulating film 20, the positively-charged movable ions move to the semiconductor substrate 50 side therein. In addition, for example, when negatively-charged movable ions are unevenly located on the semiconductor substrate 50 side in the insulating film 20, the negatively-charged movable ions move to the control electrodes 16 and 18 sides therein. Therefore, when a positive voltage is applied to the control electrodes 16 and 18 for a predetermined amount of time, the uneven distribution of the movable ions in the insulating film 20 is resolved. Once the uneven distribution of the movable ions in the insulating film 20 is resolved, the distribution of carriers in the semiconductor substrate 50 becomes normal and the depletion layer is formed normally. As a result, the decline of the withstand voltage of the diode 10 is also resolved.

In the present embodiment, a plurality of control electrodes 16 and 18 is disposed on a surface of the insulating film 20. Therefore, compared to a case in which a single control electrode is provided on a surface of the insulating film 20, a voltage can be applied more effectively to the insulating film 20 and, at the same time, the voltage applied to the control electrodes 16 and 18 can be reduced. Moreover, the period of time (the predetermined period of time described earlier) during which the positive voltage is applied to the control electrodes 16 and 18 may be set to a period of time required to resolve the uneven distribution of the movable ions in the insulating film 20. For example, the period of time during which the positive voltage is applied to the control electrodes 16 and 18 may be set to several seconds.

In addition, the positive voltage is applied to the control electrodes 16 and 18 by the drive circuit 44 in the state in which the semiconductor device 54 and the external DC power supply are not connected to each other. In other words, the positive voltage is applied to the control electrodes 16 and 18 by the drive circuit 44 when the semiconductor device 54 is not being driven. Therefore, the application of the positive voltage to the control electrodes 16 and 18 does not affect characteristics of the diode 10.

Figure 3:
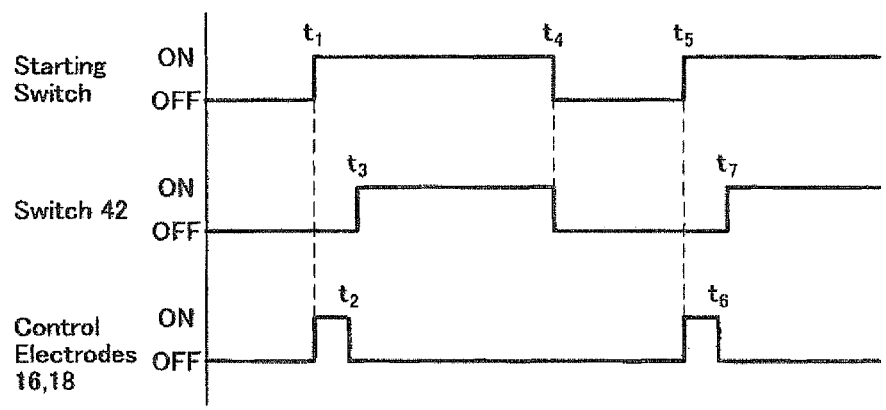
FIG. 3 shows an example of timings at which a voltage is applied to control electrodes 16 and 18.

Next, timings at which a voltage is applied to the control electrodes 16 and 18 will be described with reference to FIG. 3. In an example shown in FIG. 3, every time a starting switch is operated, a voltage is applied to the control electrodes 16 and 18 and, subsequently, the semiconductor device 54 and the external DC power supply are connected to each other. Specifically, when the starting switch of a vehicle is turned on at a time t1, the drive circuit 44 applies a voltage to the control electrodes 16 and 18 of the diode 10 while remaining in a state in which the switch 42 is switched off (the state in which the semiconductor device 54 and the external DC power supply are not connected to each other). Upon a lapse of a predetermined period of time (time t2) from the start of the application of the voltage to the control electrodes 16 and 18, the drive circuit 44 stops the application of the voltage to the control electrodes 16 and 18. Next, the drive circuit 44 turns on the switch 42 (time t3) and creates a state in which AC power can be supplied from the semiconductor device 54 to the motor. The drive circuit 44 maintains the switch 42 in the on state until the starting switch is turned off (time t4). When the starting switch is turned off at time t4, the drive circuit 44 turns off the switch 42 and creates the state in which the semiconductor device 54 and the external DC power supply are not connected to each other. Subsequently, a similar procedure is repeated every time the starting switch is operated.

Figure 4:
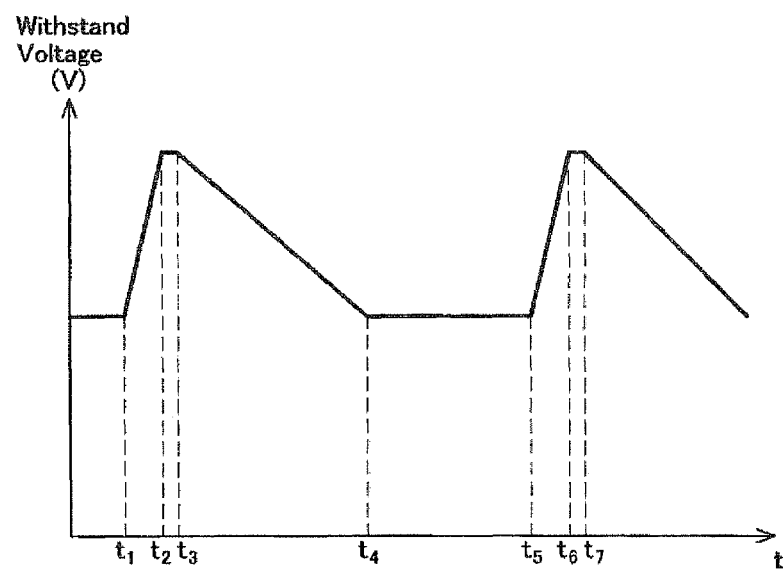
FIG. 4 schematically shows a variation with time of withstand voltage characteristics of the diode 10 when a voltage is applied to the control electrodes 16 and 18 at the timings shown in FIG. 3.

A chronological change in the withstand voltage characteristics of the diode 10 when the positive voltage is applied to the control electrodes 16 and 18 at the timings shown in FIG. 3 will now be described. As shown in FIG. 4, when the starting switch is operated at time t1 and the voltage is applied to the control electrodes 16 and 18, since the uneven distribution of the movable ions in the insulating film 20 is resolved, the withstand voltage characteristics of the diode 10 is gradually restored (time t1 to t2). Subsequently, when the switch 42 is turned on at time t3 and the semiconductor device 54 and the external DC power supply are connected to each other, since movement of the movable ions progresses with time, the withstand voltage characteristics of the diode 10 gradually declines. When the starting switch is turned off and the switch 42 is turned off at time t4, the decline of the withstand voltage characteristics of the diode 10 stops. Next, when the starting switch is operated at time t5, a voltage is applied to the control electrodes 16 and 18 until time t6 and the withstand voltage characteristics of the diode 10 are restored. Similar changes repetitively take place thereafter. Therefore, even when the withstand voltage characteristics of the diode 10 has declined at the time the starting switch is operated, due to the application of the voltage to the control electrodes 16 and 18, the withstand voltage characteristics of the diode 10 is restored and AC power is subsequently supplied to the motor. Consequently, sufficient withstand voltage characteristics can be acquired during the period of time in which the diode 10 is driven.

As is apparent from the description above, in the semiconductor device 54 according to the present embodiment, the control electrodes 16 and 18 are disposed on the surface of the insulating film 20 that covers the surface of the RESURF region 30, and the voltage is applied to the control electrodes 16 and 18. As a result, the uneven distribution of movable ions in the insulating film 20 is resolved and the decline in the withstand voltage due to the uneven distribution of the movable ions can be suppressed. In addition, the application of the voltage to the control electrodes 16 and 18 is performed when the diode 10 is not being driven. Therefore, the application of the voltage to the control electrodes 16 and 18 does not affect the characteristics of the diode 10.

Furthermore, in the present embodiment, essentially, forming the control electrodes 16 and 18 on the insulating film 20 and having the drive circuit 44 apply the voltage to the control electrodes 16 and 18 will suffice. Therefore, the decline in the withstand voltage due to the movable ions can be suppressed by an extremely simple configuration. In addition, since the control electrodes 16 and 18 and the upper surface electrode 12 can be formed by a same process, there is no need to add a new process to form the control electrodes 16 and 18.

Moreover, the technique for suppressing a decline in a withstand voltage described above is not a technique for proactively preventing movable ions from adhering to the insulating film 20 and is instead a technique for suppressing a decline in a withstand voltage by controlling movement of movable ions adhered to the insulating film 20. Therefore, a complicated structure for preventing the adherence of movable ions to the insulating film 20 need not be provided.

The preferred embodiments of the present teachings have been described above, the explanation was given using, as an example, the present teachings is not limited to this type of configuration.

For example, while the embodiment described above is an example in which the diode is formed in the semiconductor element region 100, alternatively, a semiconductor element other than the diode (for example, a power semiconductor element such as an IGBT or a MOSFET) may be formed in the semiconductor element region. Furthermore, both an IGBT and a free wheeling diode may be formed in a single semiconductor element region of a semiconductor substrate.

Figure 5:
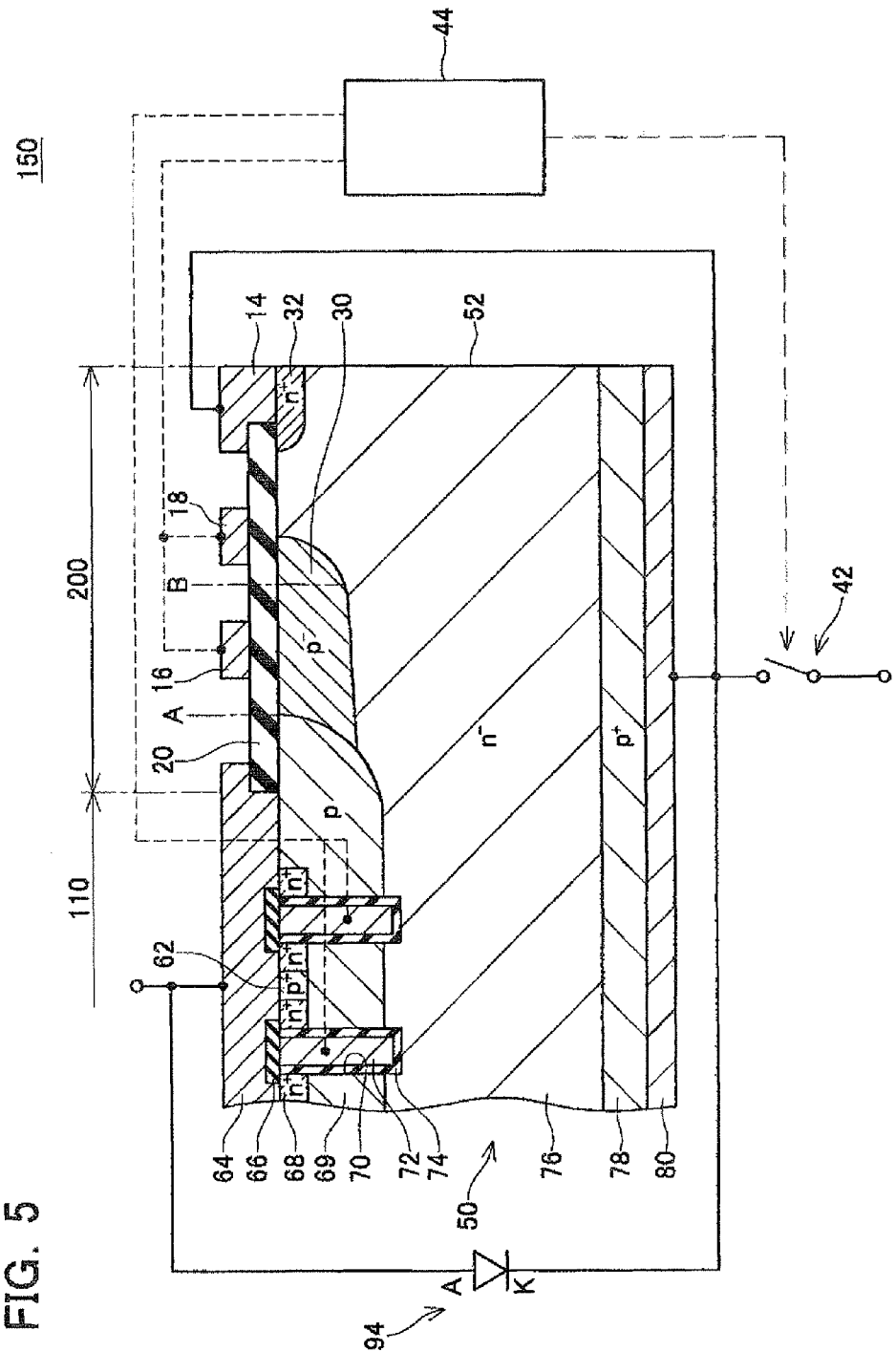
FIG. 5 is a diagram showing a configuration of a semiconductor device according to a modification.

An example in which an IGBT is formed in the semiconductor element region will now be explained in detail with reference to FIG. 5. Since the example shown in FIG. 5 shares a same configuration of the peripheral withstand voltage region 200 as the first embodiment, components similar to those of the first embodiment will be denoted by same reference numerals and a detailed description thereof will be omitted. As shown in FIG. 5, a semiconductor element region 110 of a semiconductor substrate 50 comprises a p$^+$ type (first conductivity type) collector region 78 ohmically connected to a lower surface electrode (collector electrode) 80, an n$^-$ type (second conductivity type) drift region 76 disposed on the collector region 78, a p type body region 69 disposed on the drift region 76, and n$^+$ type emitter regions 68 and p$^+$ type body contact regions 62 disposed on the body region 69. Trenches 70 are formed on a surface of the semiconductor substrate 50. The trenches 70 penetrate the emitter region 68 and the body region 69, and tips of the trenches 70 reach the drift region 76. An insulating film 74 is formed on an inner wall surface of each trench 70, and a gate electrode 72 is formed inside the insulating film 74. An insulating film 66 is formed on an upper end surface of each gate electrode 72. The gate electrodes 72 oppose, via the insulating film 74, a range of the body region 69 that separates the emitter region 68 and the drift region 76 from each other. An upper surface electrode 64 and the lower surface electrode 80 of the semiconductor substrate 50 are connected in inverse-parallel to a diode 94. Even in the example shown in FIG. 5, a drive circuit 44 applies a voltage to control electrodes 16 and 18 in a state in which a voltage is not applied to the IGBT element, which in other words is a state in which a voltage is not applied between the upper surface electrode 64 and the lower surface electrode 80. Accordingly, an uneven distribution of movable ions in the insulating film 20 is resolved and a decline in a withstand voltage of the semiconductor device can be suppressed. Moreover, as is apparent from the description above, a configuration of the present teachings (a configuration in which a voltage is applied to at least one control electrode on an insulating film) may be applied to both the IGBT and the diode comprising the power converter.

Furthermore, while the RESURF structure (the RESURF region 30) is formed as the withstand voltage structure in the embodiment described above, the withstand voltage structure other than the RESURF structure (for example, an FLR structure) may be adopted instead. Even in this case, the imbalance of the movable ions in the insulating film positioned above the withstand voltage structure can be resolved and, accordingly, the decline in the withstand voltage of the semiconductor device can be suppressed.

Moreover, while the voltage is applied to the control electrodes 16 and 18 when the starting switch of the vehicle such as an automobile is operated in the embodiment described above, the timing at which the voltage is applied to the control electrodes 16 and 18 is not limited to this example. For example, when the automobile stops momentarily, the connection between the semiconductor device and the external DC power supply may be cut-off and the voltage may be applied to the control electrodes during the cut-off period. Alternatively, the voltage may be applied to the control electrodes only during a predetermined amount of time after turning off the starting switch.

In addition, while the embodiments described above are examples in which the present teachings are applied to the power converter (inverter) mounted on the automobile, the present teachings are not limited to such an example and may be applied to semiconductor devices comprising the withstand voltage structure.

Furthermore, while the embodiments described above are examples in which silicon is used as a semiconductor material, other semiconductor material such as silicon carbide, gallium arsenide, gallium nitride, and diamond may be used instead.

Moreover, while the positive voltage is applied to the control electrodes 16 and 18 in the embodiments described above, the voltage applied to the control electrodes 16 and 18 may be appropriately varied according to the voltage applied to the insulating film 20 when driving the semiconductor device. For example, in a case in which the semiconductor substrate 50 side of the insulating film 20 assumes the low potential and the control electrodes 16 and 18 side of the insulating film 20 assumes the high potential when driving the semiconductor device, the negative voltage may be applied to the control electrodes 16 and 18.

Although two control electrodes 16 and 18 are disposed on the surface of the insulating film 20 in the embodiment described above, an arbitrary number of control electrodes may be disposed on the surface of the insulating film 20. For example, only one control electrode may be disposed on the insulating film 20, or three or more control electrodes may be disposed on the insulating film 20. In addition, when a plurality of control electrodes is disposed on the surface of the insulating film, a different voltage may be applied to each control electrode.

What is claimed is:
1. A semiconductor device comprising:
   a semiconductor substrate comprising a cell region and a non-cell region adjacent to the cell region, wherein the cell region comprises a semiconductor element and the non-cell region comprises a withstand voltage structure;
   an insulating film disposed on a surface of the non-cell region of the semiconductor substrate;
   at least one electrode disposed on a surface of the insulating film,
   a switch electronically disposed between the semiconductor element and an external power supply, and a drive circuit that (i) controls the switch to electrically disconnect the semiconductor element from the external power supply during a first period and (ii) applies a first voltage to the at least one electrode during at least a part of the first period.

2. The semiconductor device as in claim 1, wherein
the drive circuit further controls the switch to electrically connect the semiconductor element to the external power supply during a second period, and does not apply the first voltage to the electrode during the second period.

3. The semiconductor device as in claim 2, wherein
when the semiconductor element and the external power supply are connected to each other, a potential of an electrode side of the insulating film is lower than a potential of a semiconductor substrate side of the insulating film, and
when the drive circuit applies the first voltage to the electrode, the potential of the electrode side of the insulating film is higher than the potential of the semiconductor substrate side of the insulating film.

4. The semiconductor device as in claim 3, wherein
the withstand voltage structure comprises a first semiconductor region of a first conductive type, and a second semiconductor region of a second conductive type, wherein
the first semiconductor region is exposed at the surface of the semiconductor substrate,
a part of the second semiconductor region is exposed at the surface of the semiconductor substrate,
the second semiconductor region is in contact with a lower surface and one side surface of the first semiconductor region, the one side surface being located on a relatively far side from the cell region, and
the insulating film is disposed on surfaces of the first and second semiconductor regions.

5. The semiconductor device as in claim 2, wherein
when the semiconductor element and the external power supply are connected to each other, a potential of an electrode side of the insulating film is higher than a potential of a semiconductor substrate side of the insulating film, and
when the drive circuit applies the first voltage to the electrode, the potential of the electrode side of the insulating film is lower than the potential of the semiconductor substrate side of the insulating film.

6. The semiconductor device as in claim 5, wherein
the withstand voltage structure comprises a first semiconductor region of a first conductive type, and a second semiconductor region of a second conductive type, wherein
the first semiconductor region is exposed at the surface of the semiconductor substrate,
a part of the second semiconductor region is exposed at the surface of the semiconductor substrate,
the second semiconductor region is in contact with a lower surface and one side surface of the first semiconductor region, the one side surface being located on a relatively far side from the cell region, and
the insulating film is disposed on surfaces of the first and second semiconductor regions.

7. The semiconductor device as in claim 6, wherein
when the semiconductor substrate is viewed in a plan view, a first conductive type impurity concentration of a first end of the first semiconductor region is higher than that of a second end of the first semiconductor region, and
the first end of the first semiconductor region is on a relatively close side to the cell region, and the second end of the first semiconductor region is on the relatively far side from the cell region.

8. The semiconductor device as in claim 4, wherein
a first conductive type impurity concentration of a first end of the first semiconductor region is higher than that of a second end of the first semiconductor region, and
the cell region is closer to the first end of the first semiconductor region than to the second end of the first semiconductor region in a direction from the cell region to a peripheral edge of the semiconductor substrate along the surface of the semiconductor substrate.

* * * * *